US009640746B2

(12) United States Patent
Ma et al.

(10) Patent No.: US 9,640,746 B2
(45) Date of Patent: May 2, 2017

(54) HIGH PERFORMANCE HIGH TEMPERATURE THERMOELECTRIC COMPOSITES WITH METALLIC INCLUSIONS

(71) Applicant: CALIFORNIA INSTITUTE OF TECHNOLOGY, Pasadena, CA (US)

(72) Inventors: James M. Ma, Pasadena, CA (US); Sabah K. Bux, Chino Hills, CA (US); Jean-Pierre Fleurial, Altadena, CA (US); Vilupanur A. Ravi, Claremont, CA (US); Samad A. Firdosy, La Crescenta, CA (US); Kurt Star, Bellflower, CA (US); Richard B. Kaner, Los Angeles, CA (US)

(73) Assignee: California Institute of Technology, Pasadena, CA (US)

(*) Notice: Subject to any disclaimer, the term of this patent is extended or adjusted under 35 U.S.C. 154(b) by 389 days.

(21) Appl. No.: 14/161,641

(22) Filed: Jan. 22, 2014

(65) Prior Publication Data

US 2016/0111619 A1   Apr. 21, 2016

Related U.S. Application Data

(60) Provisional application No. 61/755,360, filed on Jan. 22, 2013.

(51) Int. Cl.
*H01L 35/26* (2006.01)
*H01L 35/18* (2006.01)
*H01L 35/16* (2006.01)

(52) U.S. Cl.
CPC .............. *H01L 35/26* (2013.01); *H01L 35/16* (2013.01); *H01L 35/18* (2013.01)

(58) Field of Classification Search
CPC ................................. H01L 35/16; H01L 35/18
See application file for complete search history.

(56) References Cited

U.S. PATENT DOCUMENTS

| 1,549,615 A | 10/1923 | Schroter | |
| 7,259,320 B2 * | 8/2007 | Take ....................... | B22F 1/025 136/236.1 |
| 2011/0139208 A1 * | 6/2011 | Lee .......................... | C09K 5/14 136/236.1 |
| 2013/0269739 A1 | 10/2013 | Hwang et al. | |

FOREIGN PATENT DOCUMENTS

JP   2004-186529   * 7/2004

OTHER PUBLICATIONS

Translation for JP 2004-186529, Jul. 2, 2004.*

(Continued)

*Primary Examiner* — Carol M Koslow
(74) *Attorney, Agent, or Firm* — Kilpatrick Townsend & Stockton LLP

(57) ABSTRACT

The present invention provides a composite thermoelectric material. The composite thermoelectric material can include a semiconductor material comprising a rare earth metal. The atomic percent of the rare earth metal in the semiconductor material can be at least about 20%. The composite thermoelectric material can further include a metal forming metallic inclusions distributed throughout the semiconductor material. The present invention also provides a method of forming this composite thermoelectric material.

12 Claims, 10 Drawing Sheets

(56) References Cited

OTHER PUBLICATIONS

S. K. Bux et al.,"Nanostructured Bulk Silicon as an Effective Thermoelectric Material," Advanced Functional Materials, 2009, 19, 2445-2452.

Cox, et. al., "Effect of Ca Doping on the Thermoelectric Performance of $Yb_{14}MnSb_{11}$", Journal of Electronic Materials, 2010, vol. 39, No. 9, pp. 1373-1375.

J. D. Bolton et al., "Fracture Toughness ($K_{ic}$) of Cemented Carbides," Fibre Science and Technology, 1983, 19, 37-58.

A. May et al., "Thermoelectric performance of lanthanum telluride produced via mechanical alloying," Physical Review B, 2008, 78, 125205, 1-12.

A. May et al., "Influence of band structure on the large thermoelectric performance of lanthanum telluride," Physical Review B, 2009, 79, 153101, 1-4.

A. May et al., "Optimizing Thermoelectric Efficiency in $La_{3-x}Te_4$ via Yb Substitution," Chemistry of Materials, 2010, 22, 2995-2999.

S. Bux et al., "Engineering of Novel Thermoelectric Materials and Devices for Next Generation, Long Life, 20% Efficient Space Power Systems," $11^{th}$ International Energy Conversion engineering Conference (American Institute of Aeronautics and Astronautics), 2013, 1-6.

D. J. Bergman et al., "Thermoelectric properties of a composite medium," Journal of Applied Physics, 1991, 70, 6821-6833.

D.-K. Ko et al., "Enhanced Thermopower via Carrier Energy Filtering in Solution-Processable $Pt$—$Sb_2Te_3$ Nanocomposites," Nano Letters, 2011, 11, 2841-2844.

K. Biswas et al., "High-performance bulk thermoelectric with all-scale hierarchical architectures." Nature, 2012, 489, 414-418.

S. N. Girard etal., "High Performance Na-doped PbTe—PbS Thermoelectric Materials: Electronic Density of States Modification and Shape-Controlled Nanostructures," Journal of the American Chemical Society, 2011, 133, 16588-16597.

A. I. Hochbaum et al., "Enhanced thermoelectric performance of rough silicon nanowires," Nature, 2008, 451, 163-168.

A. I. Boukai et al., "Silicon nanowires as efficient thermoelectric materials,"Nature, 2008, 451, 168-171.

D. J. Bergman et al., "Enhancement of thermoelectric power factor in composite thermoelectrics," Journal of Applied Physics, 1999, 85, 8205-8216.

B. Y. Moizhes et al., "Nontraditional methods of improvement of the thermoelectric figure-of-merit based on size effects," $11^{th}$ International Conference on Thermoelectrics, 1992, 232-235.

B. Yu et al., "Enhancement of Thermoelectric Properties by Modulation-Doping in Silicon Germanium Alloy Nanocomposites," Nano Letters, 2012, 12, 2077-2082.

Y. Pei et al., "High Thermoelectric Performance in PbTe Due to Large Nanoscale $Ag_2Te$ Preciptates and La Doping," Advanced Functional Materials, 2011, 21, 241-249.

J. Houston Dycus et al., "Atomic scale structure and chemistry of $Bi_2Te_3$/GaAs interfaces grown by metallorganic van der Waals epitaxy," Applied Physics Letters, 2013, 102, 081601, 1-4.

D. E. Aldrich et al., "Microstruc;tural characterisation of interpenetrating nickel/alumina composites," Materials Characterization, 2001, 47, 167-173.

D. R. Clarke, "Interpenetrating Phase Composites," Journal of the American Ceramic Society, 1992, 75, 739-758.

Z. Fan, "Microstructural characterization of two phase Materials," Journal of Materials Science & Technology, 1993, 9, 1094-1100.

J. M., Ma et al., "Hardness and fracture toughness of thermoelectric $La_{3-x}Te_4$." Journal of Materials Science, 2014, 49, 1150-1156.

A. G. Evans, "Perspective on the Development of High-Toughness Ceramics," Journal of the American Ceramic Society, 1990, 73(2), 187-206.

\* cited by examiner

Ni Powder

NiTe$_y$ Powder

HIGH PERFORMANCE HIGH TEMPERATURE THERMOELECTRIC COMPOSITES WITH METALLIC INCLUSIONS

CROSS-REFERENCES TO RELATED APPLICATIONS

This Application claims the benefit of priority to U.S. Provisional Application No. 61/755,360, filed Jan. 22, 2013, incorporated in its entirety herein for all purposes.

STATEMENT AS TO RIGHTS TO INVENTIONS MADE UNDER FEDERALLY SPONSORED RESEARCH OR DEVELOPMENT

This invention described herein was made in the performance of work under a NASA contract, and is subject to the provisions of Public Law 96-517 (35 U.S.C. §202) in which the Contractor has elected to retain title.

BACKGROUND OF THE INVENTION

Thermoelectric based generators have been used successfully and reliably for the past 40 years to power deep space probes. These solid-state devices rely only on a temperature gradient to produce electricity by way of the Seebeck effect. The efficiency of a thermoelectric device is directly related to the $\Delta T$, hot junction temperature, and the thermoelectric figure of merit, $zT=S^2T/\rho k$, where S is the Seebeck coefficient, $\rho$ is the electrical resistivity, $\kappa$ is the total thermal conductivity, and T is the absolute temperature. These properties are interconnected and improvement in one property often leads to diminishment of another. As a result, the zT for most thermoelectric materials has historically remained relatively low, limiting thermoelectric devices to niche applications such as in space.

Recent advances in thermoelectric materials research have led to higher efficiency materials with roughly a twofold improvement in energy conversion efficiency over legacy materials such as $Si_{1-x}Ge_x$ and PbTe. Unlike such traditional materials, however, modern high-efficiency thermoelectric materials tend to behave as weak and brittle ceramics. The fragility of these materials increases the complexity of machining, lowers the yield, and constrains potential device configurations. All of these factors add to the cost and difficulties in developing functional thermoelectric devices. Moreover, there can be significant thermal stresses during operation as the temperature differential can often be several hundred degrees between the hot and cold junction of a thermoelectric device. Poor mechanical properties result in a low tolerance to such thermomechanical stresses encountered during operation.

Early work unrelated to thermoelectric research investigated the impact of introducing transition metals into brittle cemented carbides. For instance, Bolton and Keely confirmed that the Co inclusions in WC significantly increased the facture toughness of the carbide (J. D. Bolton and R. J. Keely, Fibre Science and Technology, 1983, 19, 37-58). The ductility of Co allows for plastic deformation that inhibits the propagation of fractures while undergoing tensile stresses. However, in the case of thermoelectric materials, the introduction of transition metals presents a number of problems. Such metals are generally associated with high thermal conductivities and relatively low Seebeck coefficient values. Consequently, the introduction of metal inclusions into a thermoelectric material would be expected to result in a composite with a lower thermoelectric figure of merit thereby reducing efficiency.

What is needed is a composite thermoelectric material having improved mechanical properties without compromising thermoelectric efficiency, and a method of making such a material. Surprisingly, the present invention meets this and other needs.

SUMMARY OF THE INVENTION

In one embodiment, the present invention provides a composite thermoelectric material. The composite thermoelectric material includes a semiconductor material comprising a rare earth metal. The atomic percent of the rare earth metal in the semiconductor material is at least about 20%. The composite thermoelectric material further includes a metal forming metallic inclusions distributed throughout the semiconductor material.

In another embodiment, the present invention provides a method of preparing a composite thermoelectric material. The method includes compacting a reaction mixture comprising a semiconductor material and a metal. The semiconductor material includes a rare earth metal, and the atomic percent of the rare earth metal in the semiconductor material is at least about 20%. The compacting forms metallic inclusions that are distributed throughout the semiconductor material to form the composite thermoelectric material.

In another embodiment, the present invention provides a composite thermoelectric material prepared by a method. The method includes compacting a reaction mixture comprising a semiconductor material and a metal. The semiconductor material includes a rare earth metal, and the atomic percent of the rare earth metal in the semiconductor material is at least about 20%. The formed composite thermoelectric material comprises the rare earth metal and the metal forming metallic inclusions distributed throughout the semiconductor material.

DETAILED DESCRIPTION OF THE INVENTION

I. General

Figure 1:
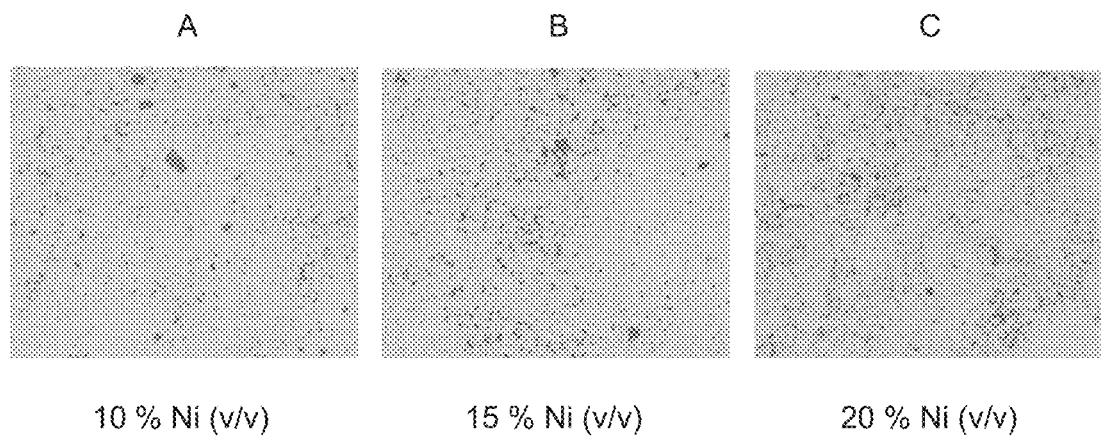
FIGS. 1A, 1B, and 1C show low magnification SEM images of composite thermoelectric materials including $La_{3-x}Te_4$ with Ni inclusions comprising about 10% (v/v), 15% (v/v), and 20% (v/v) of the composite material, respectively.

The present invention provides a composite thermoelectric material including a semiconductor material comprising a rare earth metal, the atomic percent of the rare earth metal in the semiconductor material being at least about 20%. The semiconductor material can be $La_{3-x}Te_4$, $Yb_{14}MnSb_{11}$, or other suitable semiconductor material including a rare earth metal. The composite thermoelectric material further includes a metal forming metallic inclusions distributed throughout the semiconductor material, the metal being Co, Ni, Mo, or other suitable metal. The composite thermoelectric material can be used to generate thermoelectric power.

The present invention also provides a method of making a composite thermoelectric material. A reaction mixture comprising a semiconductor material and a metal can be compacted. The semiconductor material includes a rare earth metal having an atomic percent in the semiconductor material of at least about 20%. The semiconductor material can be $La_{3-x}Te_4$, $Yb_{14}MnSb_{11}$, or other suitable semiconductor material including a rare earth metal, and the metal can be Co, Ni, Mo, or other suitable metal. The compacting forms metallic inclusions distributed throughout the semiconductor material.

In embodiments of the present invention, the mechanical properties of the thermoelectric material may be enhanced without comprising thermoelectric performance. Without being bound by any theory, when the thermoelectric composite is subjected to stress, cracks may be deflected at the metallic inclusion-semiconductor interfaces. Such deflection may inhibit the propagation of cracks, thereby improving the fracture toughness of the thermoelectric material. Further, a "crack bridging" may occur whereby the more ductile metallic inclusions are plastically deformed to create a "bridge" that spans the width of a crack. Such a toughening mode may inhibit separation along the crack, thereby improving fracture toughness. In regard to thermoelectric performance, without being bound by any theory, the introduction of metallic inclusions reduces the electrical resistivity of the thermoelectric material while unexpectedly maintaining the high Seebeck coefficient and low thermal conductivity of the thermoelectric material. As a result of such decoupling of the electronic and thermal transport properties, the thermoelectric efficiency can be preserved and, in some embodiments, unexpectedly increased.

II. Definitions

"Composite thermoelectric material" refers to a material suitable for use in thermoelectric power applications that comprises two or more constituent materials.

"Semiconductor material" refers to a material which has an electrical conductivity between that of a metal and an insulator. Semiconductor materials useful in the present include a rare earth metal. Exemplary rare earth metals include, but are not limited to, La, Ce, Pr, Nd, Sm, Eu, Gd, Tb, Dy, Ho, Er, Tm, Yb, and Lu. Exemplary semiconductor materials including such rare earth metals include, but are not limited to, ScSb, ScP, ScN, $Sc_2Se_3$, $Sc_2S_3$, $Sc_2Te_3$, YP, $Y_2Te_3$, $La_{3-x}Te_4$, LaAs, LaP, $La_2Se_3$, $La_{3-x}Se_4$, $La_2S_3$, $La_{3-x}S_4$, $LaSi_2$, $La_{10-x}Ge_6O_{27-1.5x}$, $SrLaAlO_4$, $SrLaGaO_4$, $La_2CuO_4$, $LaCrO_3$, CeP, $Ce_2Se_3$, $Ce_2S_3$, $Ce_2Te_3$, $Ce_{3-x}Te_4$, PrAs, PrP, PrSe, $Pr_2S_3$, $Pr_2Te_3$, NdAs, NdP, $Nd_2Se_3$, $Nd_2S_3$, $Nd_{3-x}S_4$, $Nd_2Te_3$, $Nd_{3-x}Te_4$, SmAs, SmP, $SeSm_2$, $Sm_2S_3$, $Sm_2Te_3$, EuAs, EuP, EuSe, EuS, EuTe, EuN, GdAs, $GdN_3$, GdP, $Gd_2Se_3$, $Nd_{3-x}Se_4$, GdS, $Gd_2Te_3$, $GdScO_3$, TbAs, TbN, TbP, SeTb, $TbSi_2$, $Tb_2S_3$, $Tb_4S_7$, TbTe, $Tb_2O_3$, DyAs, DyP, $Dy_2Se_3$, DyS, $Dy_{3-x}S_4$, $Dy_2Te_3$, HoAs, HoP, $Ho_2Se_3$, $HoSi_2$, HoTe, ErAs, ErP, $Er_2Se_3$, $Er_2S_3$, $Er_2Te_3$, TmAs, TmP, TmSe, $Tm_2S_3$, TmTe, $Yb_{14}MnSb_{11}$, YbAs, YbP, YbSe, $Yb_2S_3$, YbTe, and ternary zintl phases such as $YbMn_2Sb_2$, $YbCd_2Sb_2$, $YbZn_2Sb_2$, $EuZn_2Sb_2$, $EdCd_2Sb_2$, $Eu_2ZnSb_2$, $Yb_2CdSb_2$, $Yb_9Mn_{4.5}Sb_9$, and the like, where subscript x is from about 0 to 0.33.

"Metal" refers to elements of the periodic table that are metallic and that can be neutral, or negatively or positively charged as a result of having more or fewer electrons in the valence shell than is present for the neutral metallic element. Exemplary metals include, but are not limited to, alkali earth metals such as Li, Na, K, Rb and Cs, alkaline earth metals such as Be, Mg, Ca, Sr and Ba, transition metals such as Sc, Ti, V, Cr, Mn, Fe, Co, Ni, Cu, Zn, Y, Zr, Nb, Mo, Ru, Rh, Pd, Ag, Cd, Hf, Ta, W, Re, Os, Ir, Pt, Au, and Hg, and post-transition metals such as B, Al, Ga, In, Tl, Ge, Sn, Pb, Sb, and Bi. One of skill in the art will appreciate that the metals described above can each adopt several different oxidation states, all of which are useful in the present invention. In some instances, the most stable oxidation state is formed, but other oxidation states are useful in the present invention.

"Inclusion" refers to a particle comprising a first material that is embedded within a second material. The first material can be an elemental species or a compound. The inclusions described herein include metallic inclusions distributed throughout a semiconductor material.

"Compacting" refers to the process of forming a bulk material from a powder. For instance, compacting may include a sintering process whereby a powder is heated below the melting point and pressure is applied such that the powder particles fuse together to form the bulk material.

"Thermoelectric Figure of Merit" refers to a dimensionless value that governs the efficiency of a thermoelectric material. The thermoelectric figure of merit "zT" is defined as $zT = S^2 T/\rho\kappa$, where S is the Seebeck coefficient, $\rho$ is the electrical resistivity, $\kappa$ is the total thermal conductivity, and T is the absolute temperature.

III. Composite Thermoelectric Materials

The present invention provides a composite thermoelectric material. In some embodiments, the present invention provides a composite thermoelectric material comprising a semiconductor material including a rare earth metal. The atomic percent of the rare earth metal in the semiconductor material can be at least about 20%. The composite thermoelectric material can further comprise a metal forming inclusions that are distributed throughout the semiconductor material.

The rare earth metal included in the semiconductor material can be any rare earth metal suitable for thermoelectric applications. Suitable rare earth metals include, but are not limited to, La, Ce, Pr, Nd, Sm, Eu, Gd, Tb, Dy, Ho, Er, Tm, Yb, and Lu. In some embodiments, the rare earth metal can be La or Yb.

The metal forming the metallic inclusions can be any suitable metal that can form inclusions within a semiconductor material. Suitable metals include alkali earth metals such as Li, Na, K, Rb and Cs, alkaline earth metals such as Be, Mg, Ca, Sr and Ba, transition metals such as Sc, Ti, V, Cr, Mn, Fe, Co, Ni, Cu, Zn, Y, Zr, Nb, Mo, Ru, Rh, Pd, Ag, Cd, Hf, Ta, W, Re, Os, Ir, Pt, Au, and Hg, and post-transition metals such as B, Al, Ga, In, Tl, Ge, Sn, Pb, Sb, and Bi. In some embodiments, the metal can be a transition metal such as Sc, Ti, V, Cr, Mn, Fe, Co, Ni, Cu, Zn, Y, Zr, Nb, Mo, Ru, Rh, Pd, Ag, Cd, Hf, Ta, W, Re, Os, Ir, Pt, Au, or Hg. In other embodiments, the metal can be a Group VIB transition metal such as Cr, Mo, or W, or a Group VIIIB transition metal such as Co, Rh, Ir, Ni, Pd, or Pt. In other embodiments, the metal can be Co, Ni, or Mo.

The semiconductor material can be any semiconductor material including a rare earth metal having an atomic percent in the semiconductor material of at least about 20%, and that is suitable for thermoelectric applications. Such suitable semiconductor materials include, but are not limited to, ScSb, ScP, ScN, $Sc_2Se_3$, $Sc_2S_3$, $Sc_2Te_3$, YP, $Y_2Te_3$, $La_{3-x}Te_4$, LaAs, LaP, $La_2Se_3$, $La_{3-x}Se_4$, $La_2S_3$, $La_{3-x}S_4$, $LaSi_2$, $La_{10-x}Ge_6O_{27-1.5x}$, $SrLaAlO_4$, $SrLaGaO_4$, $La_2CuO_4$, $LaCrO_3$, CeP, $Ce_2Se_3$, $Ce_2S_3$, $Ce_2Te_3$, $Ce_{3-x}Te_4$, PrAs, PrP, PrSe, $Pr_2S_3$, $Pr_2Te_3$, NdAs, NdP, $Nd_2Se_3$, $Nd_2S_3$, $Nd_{3-x}S_4$, $Nd_2Te_3$, $Nd_{3-x}Te_4$, SmAs, SmP, $SeSm_2$, $Sm_2S_3$, $Sm_2Te_3$, EuAs, EuP, EuSe, EuS, EuTe, EuN, GdAs, $GdN_3$, GdP, $Gd_2Se_3$, $Nd_{3-x}Se_4$, GdS, $Gd_2Te_3$, $GdScO_3$, TbAs, TbN, TbP, SeTb, $TbSi_2$, $Tb_2S_3$, $Tb_4S_7$, TbTe, $Tb_2O_3$, DyAs, DyP, $Dy_2Se_3$, DyS, $Dy_{3-x}S_4$, $Dy_2Te_3$, HoAs, HOP, $Ho_2Se_3$, $HoSi_2$, HoTe, ErAs, ErP, $Er_2Se_3$, $Er_2S_3$, $Er_2Te_3$, TmAs, TmP, TmSe, $Tm_2S_3$, TmTe, $Yb_{14}MnSb_{11}$, YbAs, YbP, YbSe, $Yb_2S_3$, YbTe, and ternary zintl phases such as $YbMn_2Sb_2$, $YbCd_2Sb_2$, $YbZn_2Sb_2$, $EuZn_2Sb_2$, $EdCd_2Sb_2$, $Eu_2ZnSb_2$, $Yb_2CdSb_2$, $Yb_9Mn_{4.5}Sb_9$, and the like, where subscript x is from about 0 to 0.33.

In some embodiments, the semiconductor material can be $La_{3-x}Te_4$ or $Yb_{14}MnSb_{11}$, where subscript x is from about 0 to 0.33, and the metal forming the metallic inclusions can be Co, Ni, or Mo. In some embodiments, when the semiconductor material is $La_{3-x}Te_4$, subscript x can be from about 0.03 to 0.3, 0.1 to 0.3, 0.15 to 0.3, 0.2 to 0.3, 0.23 to 0.3, or from about 0.23 to 0.28.

In some embodiments, the semiconductor material can be $La_{3-x}Te_4$, the metal forming the metallic inclusion can be Ni, and the metallic inclusions can comprise about 0.1 to 18% (v/v) of the composite thermoelectric material. In some embodiments, the Ni inclusions can comprise about 10 to 18% (v/v) of the composite thermoelectric material. In some embodiments, the Ni inclusions can comprise about 10 to 17% (v/v), 11 to 17% (v/v), 12 to 17% (v/v), 12 to 16% (v/v), or about 12 to 15% (v/v) of the composite thermoelectric material. In some other embodiments, the Ni inclusions can comprise less than about 10% (v/v) or more than about 15% (v/v) of the composite thermoelectric material. The distribution of the Ni inclusions in the $La_{3-x}Te_4$ semiconductor material may vary depending on the volume fraction of Ni. FIGS. 1A, 1B, and 1C show low magnification SEM images of Ni inclusions (dark regions) in $La_{3-x}Te_4$ with the inclusions comprising about 10% (v/v), 15% (v/v), and 20% (v/v) of the composite material, respectively.

Figure 2:
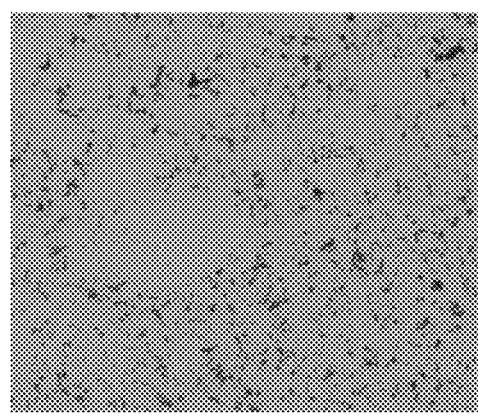
FIG. 2 shows a low magnification SEM image of a composite thermoelectric material including $La_{3-x}Te_4$ with Co inclusions comprising about 5% (v/v) of the composite material.

In some embodiments, the semiconducting material can be $La_{3-x}Te_4$, the metal forming the metallic inclusions can be Co, and the metallic inclusions can comprise about 0.1 to 5.0% (v/v) of the composite thermoelectric material. In some embodiments, the Co inclusions can comprise about 0.5 to 5.0% (v/v), 1.0 to 5.0% (v/v), 1.5 to 5.0% (v/v), 2.0 to 5.0% (v/v), 2.5 to 5% (v/v), or about 3 to 5% (v/v) of the composite thermoelectric material. In some other embodiments, the Co inclusions can comprise less than about 0.1% (v/v) or more than about 5.0% (v/v) of the composite thermoelectric material. As with the Ni inclusions, the distribution of the Co inclusions in the $La_{3-x}Te_4$ semiconductor material may vary depending on the volume fraction of Co. FIG. 2 shows a low magnification SEM image of Co inclusions (dark regions) in $La_{3-x}Te_4$ with the inclusions comprising about 5.0% (v/v).

Figure 3:
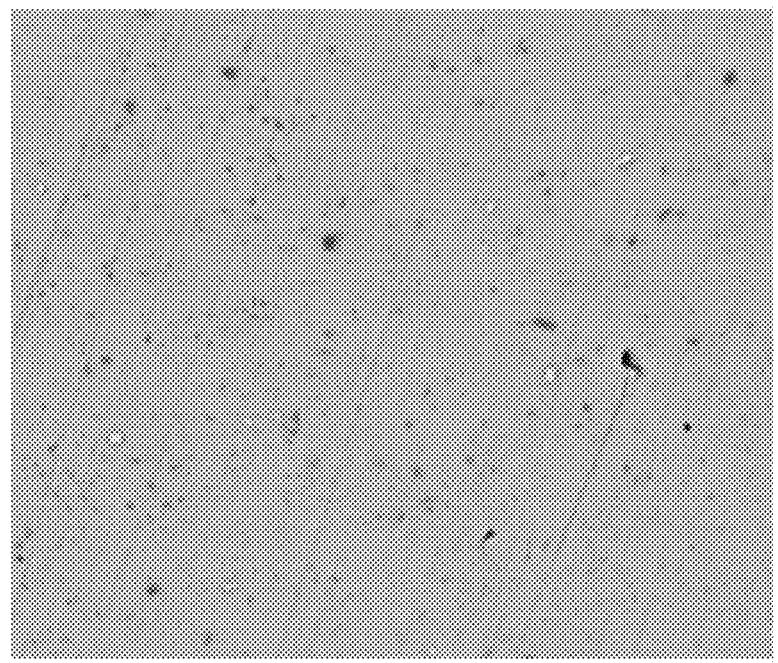
FIG. 3 shows a low magnification SEM image of a composite thermoelectric material including $Yb_{14}MnSb_{11}$ with Mo inclusions comprising about 2% (v/v) of the composite material.

In some embodiments, the semiconducting material can be $Yb_{14}MnSb_{11}$, the metal forming metallic inclusions can be Mo, and the metallic inclusions can comprise about 0.1 to 2.0% (v/v) of the composite thermoelectric material. In some embodiments, the Mo inclusions can comprise about 0.3 to 2.0% (v/v), 0.5 to 2.0% (v/v), 0.8 to 2.0% (v/v), 1.0 to 2.0% (v/v), 1.3 to 2.0% (v/v), or about 1.5 to 2.0% (v/v) of the composite thermoelectric material. In some other embodiments, the Mo inclusions can comprise less than about 0.1% (v/v) or more than about 5.0% (v/v). As with the Ni and Co inclusions in $La_{3-x}Te_4$, the distribution of the Mo inclusions in the $Yb_{14}MnSb_{11}$ semiconductor material may vary depending on the volume fraction of Mo. FIG. 3 shows a low magnification SEM image of Mo inclusions (dark regions) in $Yb_{14}MnSb_{11}$ with the inclusions comprising about 2.0% (v/v).

Figure 4:
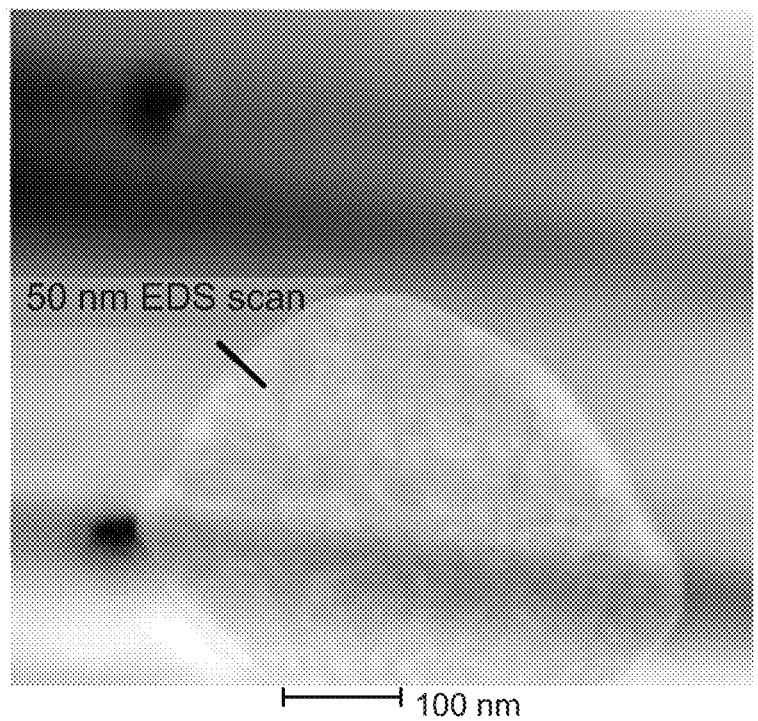
FIG. 4 shows a HAADF STEM micrograph of a Ni inclusion in a $La_{3-x}Te_4$—Ni composite thermoelectric material.

The metallic inclusions of the present invention can have any suitable size and shape. For instance, Ni inclusions formed in $La_{3-x}Te_4$ can have the size and shape shown in the HAADF STEM micrograph of FIG. 4. In some embodiments, some or all of the metallic inclusions can have a size (i.e. at least one dimension) greater than about 100, 150, 200, 250, 350, 450, 550, 650, 750, 850, or greater than about 950 nm. In some embodiments, at least a portion of the metallic inclusions have a size greater than about 1 micron.

The composite thermoelectric materials of the present invention may have enhanced mechanical properties as a result of the metallic inclusions. Without being bound by any theory, when the thermoelectric composite is subjected to stress, cracks may be deflected at the metallic inclusion-semiconductor interfaces. Such deflection may inhibit the propagation of cracks, thereby improving the fracture toughness of the thermoelectric material. Further, since the metallic inclusions may be more ductile than the semiconducting material, the metallic inclusions may undergo plastic deformation when undergoing stress, further improving the fracture toughness and flexural strength of the thermoelectric material. For instance, a "crack bridging" may occur whereby the metallic inclusions are plastically deformed to create a "bridge" that spans the width of a crack and that inhibits separation.

In some embodiments, the composite thermoelectric material can surprisingly have a figure of merit (zT) about equal to or greater than the figure of merit of the semiconductor material. Thus, the mechanical properties of the thermoelectric material may be enhanced without compromising thermoelectric efficiency. Without being bound by any theory, the metallic inclusions may form a percolated electrical network that reduces the electrical resistivity of the thermoelectric material. At volume fractions up to the percolation threshold, the high thermal conductivity of the metallic inclusions relative to the semiconductor material results in regions where the metallic inclusions can act as a thermal shunt, thereby rendering the inclusion essentially as a void in terms of the Seebeck coefficient. Since the Seebeck coefficient of a bulk material is largely unaffected by voids in the material, the lower Seebeck metallic inclusions may contribute less to the overall Seebeck coefficient of the composite material. Further, by selecting a metal with a high Seebeck coefficient relative to the semiconductor material, the reduction in overall Seebeck coefficient at volume fractions above the percolation threshold can be inhibited.

Figure 5:
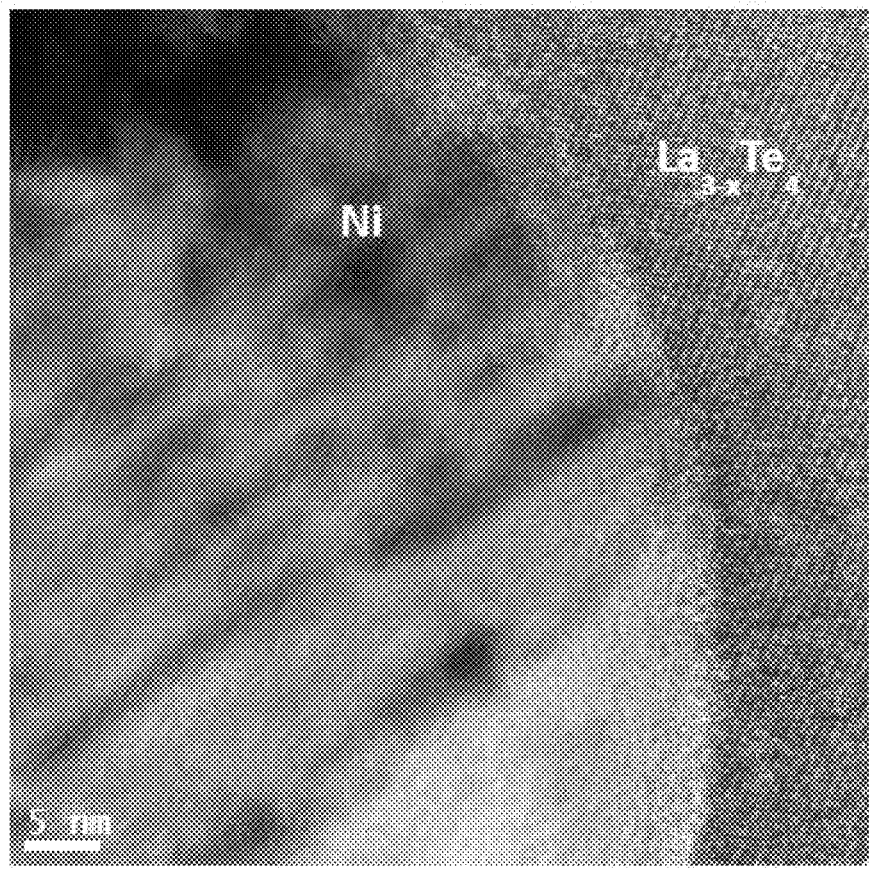
FIG. 5 shows a high resolution TEM image of a $La_{3-x}Te_4$—Ni interface in a composite thermoelectric material.
Figure 6:
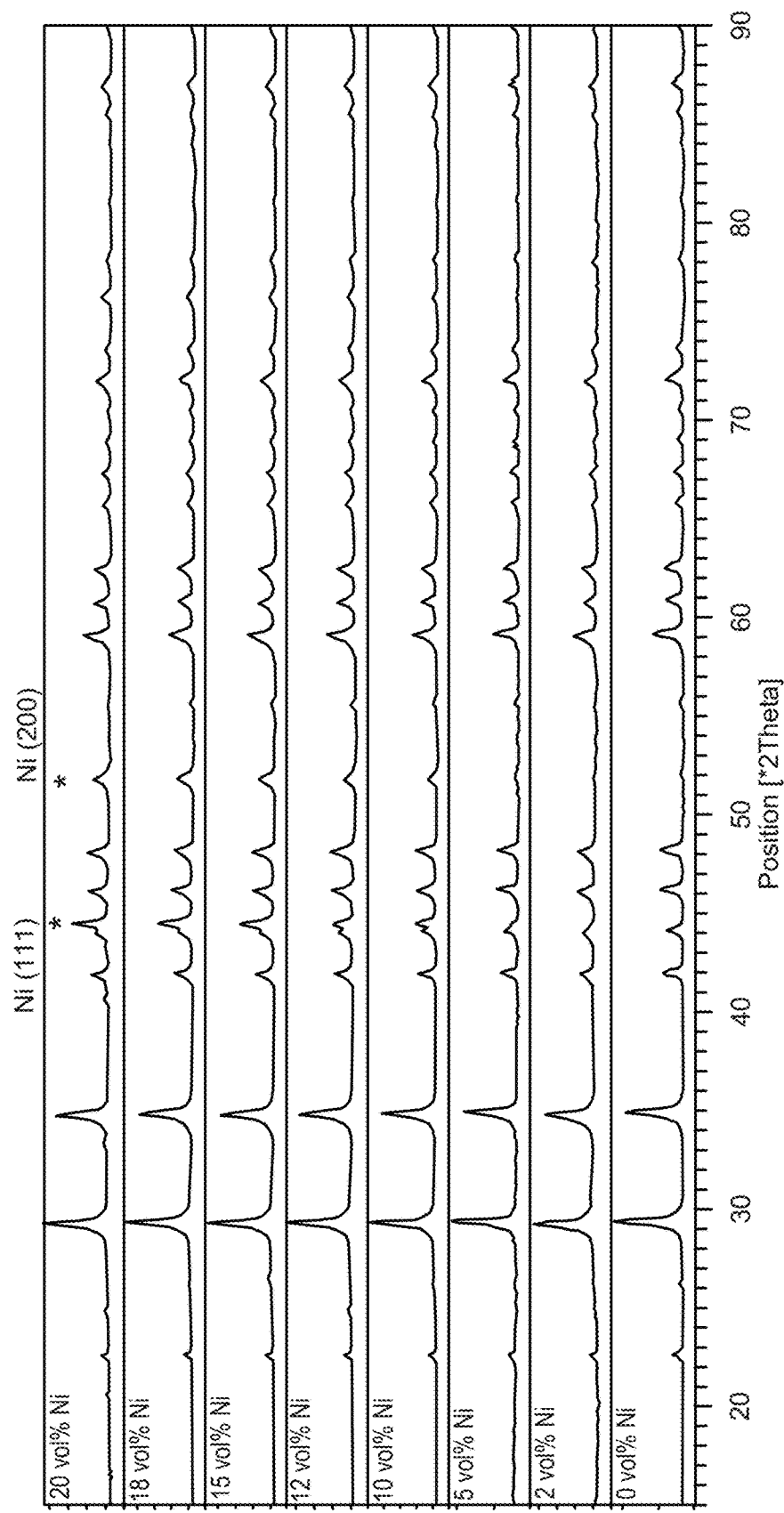
FIG. 6 shows an X-ray diffraction pattern of a composite thermoelectric material comprising $La_{3-x}Te_4$ and Ni inclusions.

Additionally, introduction of the metallic inclusions into the semiconductor material can result in a reduction in resistivity without the expected increase in thermal conductivity. In some embodiments, the metallic inclusions of the present invention are "inert" such that they do not react with the semiconductor material. For instance, as seen in the high resolution TEM image of FIG. 5, there is no observable reaction layer formed at the $La_{3-x}Te_4$—Ni interface. The X-ray diffraction pattern shown in FIG. 6 further suggests that no reaction phase forms between the $La_{3-x}Te_4$ semiconductor material and Ni inclusions. Without being bound by any theory, increases in thermal conductivity caused by the metallic inclusions may be suppressed by phonon scattering at the semiconductor-inclusion interfaces due to large mismatches in thermal transport properties.

In some embodiments, the composite thermoelectric material of the present invention can comprise the semiconductor material including a rare earth metal, wherein the atomic percent of the rare earth metal is at least about 20%. The semiconductor material can be $La_{3-x}$—$Te_4$ or $Yb_{14}MnSb_{11}$, where subscript x is from about 0 to 0.33. The composite thermoelectric material can further includes the metal forming metallic inclusions distributed throughout the semiconductor material, the metal being Co, Ni, or Mo. The composite thermoelectric material can have a figure of merit (zT) about equal to or greater than the figure of merit of the semiconductor material.

IV. Method of Making Composite Thermoelectric Material

The present invention also provides a method of making a composite thermoelectric material. In some embodiments, the method includes compacting a reaction mixture comprising a semiconductor material and a metal. The semiconductor material can include a rare earth metal, the atomic percent of the rare earth metal in the semiconductor material being at least about 20%. The compacting can form metallic inclusions distributed throughout the semiconductor material.

The rare earth metal included in the semiconductor material can be any rare earth metal suitable for thermoelectric applications. Suitable rare earth metals include, but are not limited to, La, Ce, Pr, Nd, Sm, Eu, Gd, Tb, Dy, Ho, Er, Tm, Yb, and Lu. In some embodiments, the rare earth metal can be La or Yb.

The metal forming the metallic inclusions can be any suitable metal that can form inclusions within a semiconductor material. Suitable metals include alkali earth metals such as Li, Na, K, Rb and Cs, alkaline earth metals such as Be, Mg, Ca, Sr and Ba, transition metals such as Sc, Ti, V, Cr, Mn, Fe, Co, Ni, Cu, Zn, Y, Zr, Nb, Mo, Ru, Rh, Pd, Ag, Cd, Hf, Ta, W, Re, Os, Ir, Pt, Au, and Hg, and post-transition metals such as Al, Ga, In, Tl, Ge, Sn, Pb, Sb, Bi, and Po. In some embodiments, the metal can be a transition metal such as Sc, Ti, V, Cr, Mn, Fe, Co, Cu, Zn, Y, Zr, Nb, Mo, Ru, Rh, Pd, Ag, Cd, Hf, Ta, W, Re, Os, Ir, Pt, Au, or Hg. In other embodiments, the metal can be a Group VIB transition metal such as Cr, Mo, or W, or a Group VIIIB transition metal such as Co, Rh, Ir, Ni, Pd, or Pt. In some embodiments, the metal can be Co, Ni, or Mo. In some embodiments, the metal included in the reaction mixture can be part of a compound including one or more additional elements. For instance, in some embodiments, the metal can be Ni and the compound can be $NiTe_y$.

The semiconductor material can be any semiconductor material including a rare earth metal having an atomic percent in the semiconductor material of at least about 20%, and that is suitable for thermoelectric applications. Such suitable semiconductor materials include, but are not limited to, ScSb, ScP, ScN, $Sc_2Se_3$, $Sc_2S_3$, $Sc_2Te_3$, YP, $Y_2Te_3$, $La_{3-x}Te_4$, LaAs, LaP, $La_2Se_3$, $La_2S_3$, $LaSi_2$, $La_{10-x}Ge_6O_{27-1.5x}$, $SrLaAlO_4$, $SrLaGaO_4$, $La_2CuO_4$, $LaCrO_3$, CeP, $Ce_2Se_3$, $Ce_2S_3$, $Ce_2Te_3$, PrAs, PrP, PrSe, $Pr_2S_3$, $Pr_2Te_3$, NdAs, NdP, $Nd_2Se_3$, $Nd_2S$, $Nd_2Te_3$, SmAs, SmP, $SeSm_2$, $Sm_2S_3$, $Sm_2Te_3$, EuAs, EuP, EuSe, EuS, EuTe, EuN, GdAs, $GdN_3$, GdP, $Gd_2Se_3$, GdS, $Gd_2Te_3$, $GdScO_3$, TbAs, TbN, TbP, SeTb, $TbSi_2$, $Tb_2S_3$, $Tb_4S_7$, TbTe, $Tb_2O_3$, DyAs, DyP, $Dy_2Se_3$, DyS, $Dy_2Te_3$, HoAs, HoP, $Ho_2Se_3$, $HoSi_2$, HoTe, ErAs, ErP, $Er_2Se_3$, $Er_2S_3$, $Er_2Te_3$, TmAs, TmP, TmSe, $Tm_2S_3$, TmTe, $Yb_{14}MnSb_{11}$, YbAs, YbP, YbSe, $Yb_2S_3$, and YbTe, where subscript x is from about 0 to 0.33.

In some embodiments, the semiconductor material can be $La_{3-x}Te_4$ or $Yb_{14}MnSb_{11}$, where subscript x is from about 0 to 0.33, and the metal can be Co, Ni, or Mo. In some embodiments, when the semiconductor material is $La_{3-x}Te_4$, subscript x can be from about 0.03 to 0.3, 0.1 to 0.3, 0.15 to 0.3, 0.2 to 0.3, 0.23 to 0.3, or from about 0.23 to 0.28.

In some embodiments, the metal included in the reaction mixture can be part of a compound including one or more elements of the semiconductor material. For instance, in some embodiments, the metal can be Ni that is present in the reaction mixture in the form of $NiTe_y$, where subscript y can be from about 1.0 to 1.5, and the semiconductor material can be lanthanum telluride that is deficient in Te. In some embodiments, subscript y can be from about 1.1 to 1.5, 1.2 to 1.5, 1.3 to 1.5, or from about 1.4 to 1.5. During compacting of this reaction mixture, the Te-deficient lanthanum telluride may "take" Te from the $NiTe_y$ metal, thereby forming $La_{3-x}Te_4$ with Ni inclusions. As described in greater detail below, the use of $NiTe_y$ and Te-deficient lanthanum telluride can result in a different microstructure than that observed with Ni and $La_{3-x}Te_4$ as the reaction mixture. In particular, in this embodiment, agglomeration of the Ni inclusions may be reduced which creates smaller and more randomly dispersed Ni inclusions in the $La_{3-x}Te_4$ semiconductor material.

The metallic inclusions of the present invention can have any suitable size and shape. For instance, Ni inclusions formed in $La_{3-x}Te_4$ can have the size and shape shown in the HAADF STEM micrograph of FIG. 4. In some embodiments, some or all of the metallic inclusions can have a size (i.e. at least one dimension) greater than about 100, 150, 200, 250, 350, 450, 550, 650, 750, 850, or greater than about 950 nm. In some embodiments, at least a portion of the metallic inclusions have a size greater than about 1 micron.

In some embodiments, the reaction mixture can be in powder form, and the compacting can include sintering the reaction mixture. For instance, a reaction mixture can be prepared by mixing the semiconductor material and the metal using a mixer mill (e.g., a ball milling device), mortar and pestle, or any other suitable mixing apparatus. Upon preparation, the reaction mixture can be sintered using any suitable technique. For instance, a hot pressing technique may be used in which the reaction mixture is placed into a mold with heat and pressure being applied simultaneously. The heat can be applied using any suitable technique such as induction heating, indirect resistance heating, and field assisted sinter technique (FAST)/direct hot pressing. The heat and pressure applied to the material can be sufficient to induce sintering of the reaction mixture and creep processes. In some embodiments, a spark plasma sintering (SPS) technique may be used in which the reaction mixture is placed into a mold with pressure being applied in combination with a pulsed DC current that provides internal heating, thereby sintering the reaction mixture. In some embodiments, a hybrid compacting method such as FAST/SPS may be utilized.

In some embodiments, the method of the present invention comprises compacting the reaction mixture including a semiconductor material and a metal, the reaction mixture being in powder form. The semiconductor material can include a rare earth element, the atomic percent of the rare earth element in the semiconducting material being at least about 20%. The semiconductor material can be $La_{3-x}Te_4$ or $Yb_{14}MnSb_{11}$, where subscript x is from about 0 to 0.33. The metal can be Co, Ni, or Mo. The compacting can include sintering the reaction mixture and forms metallic inclusions distributed throughout the semiconductor material.

In some embodiments, a composite thermoelectric material is prepared by a method comprising compacting a reaction mixture including a semiconductor material and a metal, the semiconductor material comprising a rare earth metal. The atomic percent of the rare earth metal in the semiconductor material can be at least about 20%. The prepared composite thermoelectric material can comprise the semiconductor material including the rare earth metal, and the metal forming metallic inclusions distributed throughout the semiconductor material.

In some embodiments, the semiconductor material can be $La_{3-x}Te_4$ or $Yb_{14}MnSb_{11}$, where subscript x is from about 0 to 0.33, and the metal included in the reaction mixture can be Co, Ni, or Mo. In some embodiments, the reaction mixture can be in powder form, and the compacting can include sintering the reaction mixture.

In some embodiments, the prepared composite thermoelectric material can have a figure of merit (zT) about equal to or greater than the figure merit of the semiconductor material.

In some embodiments, the composite thermoelectric material is prepared by a method comprising compacting the reaction mixture including a semiconductor material and a metal, the reaction mixture being in powder form. The semiconductor material can include a rare earth metal, the atomic percent of the rare earth metal in the semiconductor material being at least about 20%. The semiconductor material can be $La_{3-x}Te_4$ or $Yb_{14}MnSb_{11}$, where subscript x is from about 0 to 0.33. The metal can be Co, Ni, or Mo, and the compacting can comprise sintering the reaction mixture. The prepared composite thermoelectric material can comprise the semiconductor material including the rare earth metal and the metal forming metallic inclusions distributed throughout the semiconductor material. The prepared composite thermoelectric material can have a figure of merit (zT) about equal to or greater than the figure merit of the semiconductor material.

V. Examples

Example 1

Producing a $La_{3-x}Te_4$—Ni Composite Thermoelectric Material

This example provides a method according to the present invention of producing a composite thermoelectric material comprising $La_{3-x}Ta_4$ with Ni inclusions.

A homogenous mixture of $La_{2.77}Te_4$ and Ni powders was prepared. The $La_{2.77}Te_4$ powder was prepared using a procedure previously reported by May and co-workers (A. May et al., Physical Review B, 2008, 78, 1-12). Ni powder (from Alfa Aesar) having a size of 2.2-3.0 microns was added to $La_{2.77}Te_4$ powder to yield approximately 2% (v/v) of Ni in an argon glove box. The mixture was then removed from the argon glove box and loaded into a stainless steel vial and sealed. The mixture was mixed for about 30 minutes using a SPEX mixer mill with no ball bearings. Upon mixing, the vial was returned to the argon glove box. The powder mixture was then loaded into 12.7 mm graphite dies and transferred to a SPS furnace. The mixture was then sintered in the SPS furnace for approximately 30 minutes at a pressure of approximately 80 MPa and up to a temperature of approximately 1350° C. The temperature profile included a 30° C./min increase to 1350° C. followed by a cooling rate of 200° C./min.

The above method was repeated for powder mixtures comprising approximately 5% (v/v), 10% (v/v), 12% (v/v), 15% (v/v), 18% (v/v), and 20% (v/v) of Ni in the powder mixture. A sample including $La_{2.77}Te_4$ with no Ni was also prepared for purposes of comparison.

Vickers hardness tests were performed on the samples with the spalling (i.e. chipping) and crack formation caused by the Vickers indenter in the $La_{2.77}Te_4$—Ni samples being compared to that of the $La_{2.77}Te_4$ baseline sample. Reduced spalling and crack formation were observed in each of the tested samples, and the 10% (v/v) $La_{2.77}Te_4$—Ni sample further demonstrated improved flexural strength. For instance, the 10% (v/v) $La_{2.77}Te_4$—Ni demonstrated an increase in average flexural strength of about 23%, an increase in characteristic strength of about 19%, and an increase in Weibull Modulus of about 71%.

The electrical resistivity, thermal conductivity, and Seebeck coefficient of each sample were measured at various temperatures.

Figure 7:
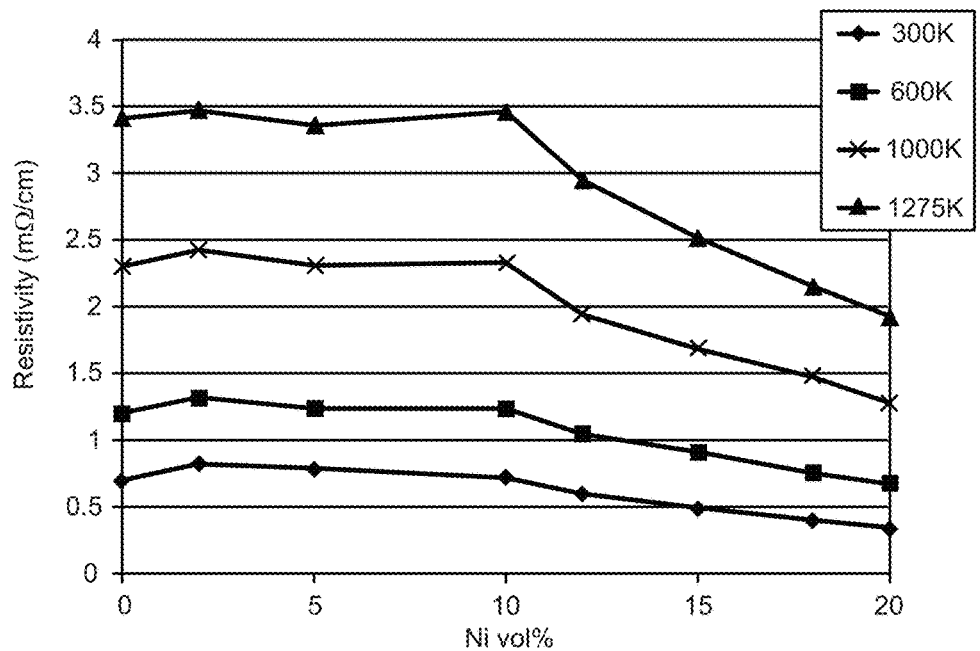
FIG. 7 shows measurements of the electrical resistivity as a function of Ni volume fraction at various temperatures for a $La_{2.77}Te_4$—Ni composite thermoelectric material.

FIG. 7 shows the electrical resistivity as a function of the volume fraction of Ni at 300K, 600K, 100K, and 1275K. At Ni volume fractions up to 10%, the resistivity of the $La_{2.77}Te_4$—Ni samples remained relatively unchanged. For volume fractions above 10%, however, the resistivity begins to significantly decrease. Without being bound by any theory, at a volume fraction of 10%, the Ni inclusions may form a percolated electrical network that reduces the overall resistivity of $La_{2.77}Te_4$—Ni composite.

Figure 8:
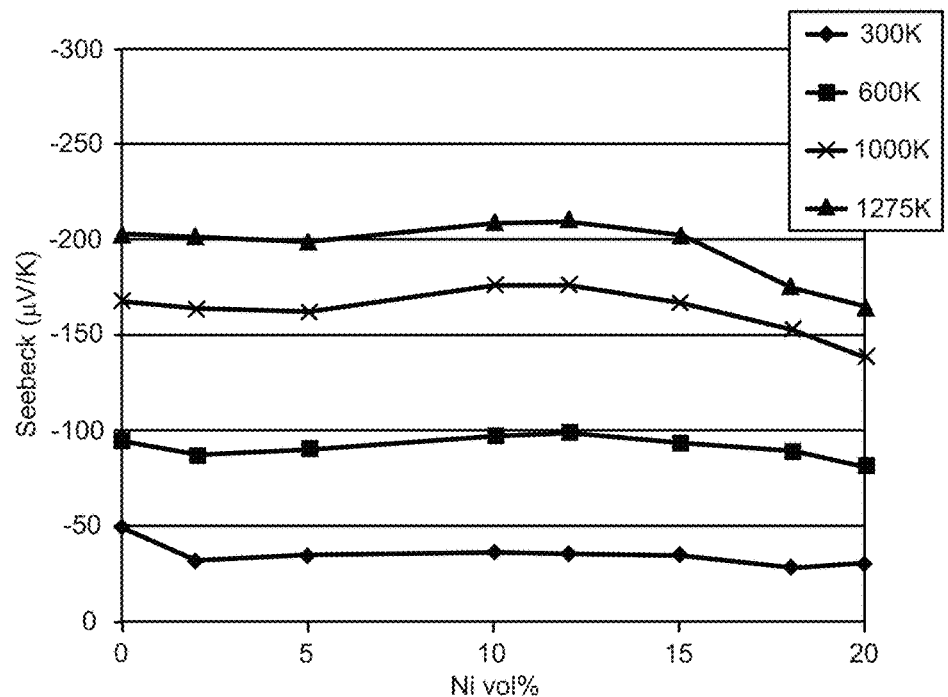
FIG. 8 shows measurements of the Seebeck coefficient as a function of Ni volume fraction at various temperatures for a $La_{2.77}Te_4$—Ni composite thermoelectric material.

FIG. 8 shows the Seebeck coefficient as a function of the volume fraction of Ni at 300K, 600K, 100K, and 1275K. As seen in FIG. 8, the Seebeck coefficient remains relatively unchanged up to a Ni volume fraction of 12%. Without being bound by any theory, the high thermal conductivity of the Ni inclusions relative to the $La_{2.77}Te_4$ may result in regions where the inclusions act as a thermal shunt, thereby rendering the inclusions essentially as voids in terms of the Seebeck coefficient. At Ni volume fractions greater than 12%, a reduction in Seebeck coefficient is observed at the higher temperatures. However, from 10 to 12%, this reduction in Seebeck is relatively moderate. Without being bound by any theory, Ni has a high Seebeck coefficient relative to $La_{2.77}Te_4$ which may delay the increase in overall Seebeck coefficient until beyond 15% (v/v) of Ni.

Figure 9:
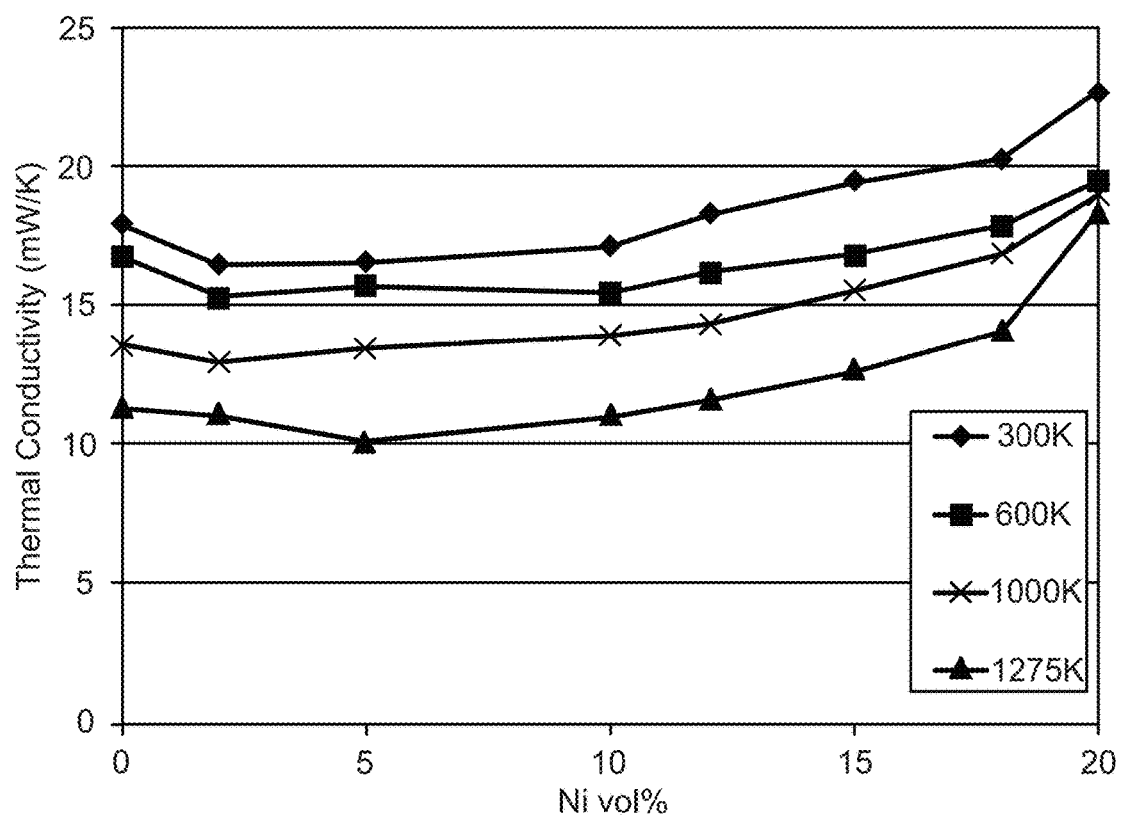
FIG. 9 shows measurements of the thermal conductivity as a function of Ni volume fraction at various temperatures for a $La_{2.77}Te_4$—Ni composite thermoelectric material.
Figure 10:
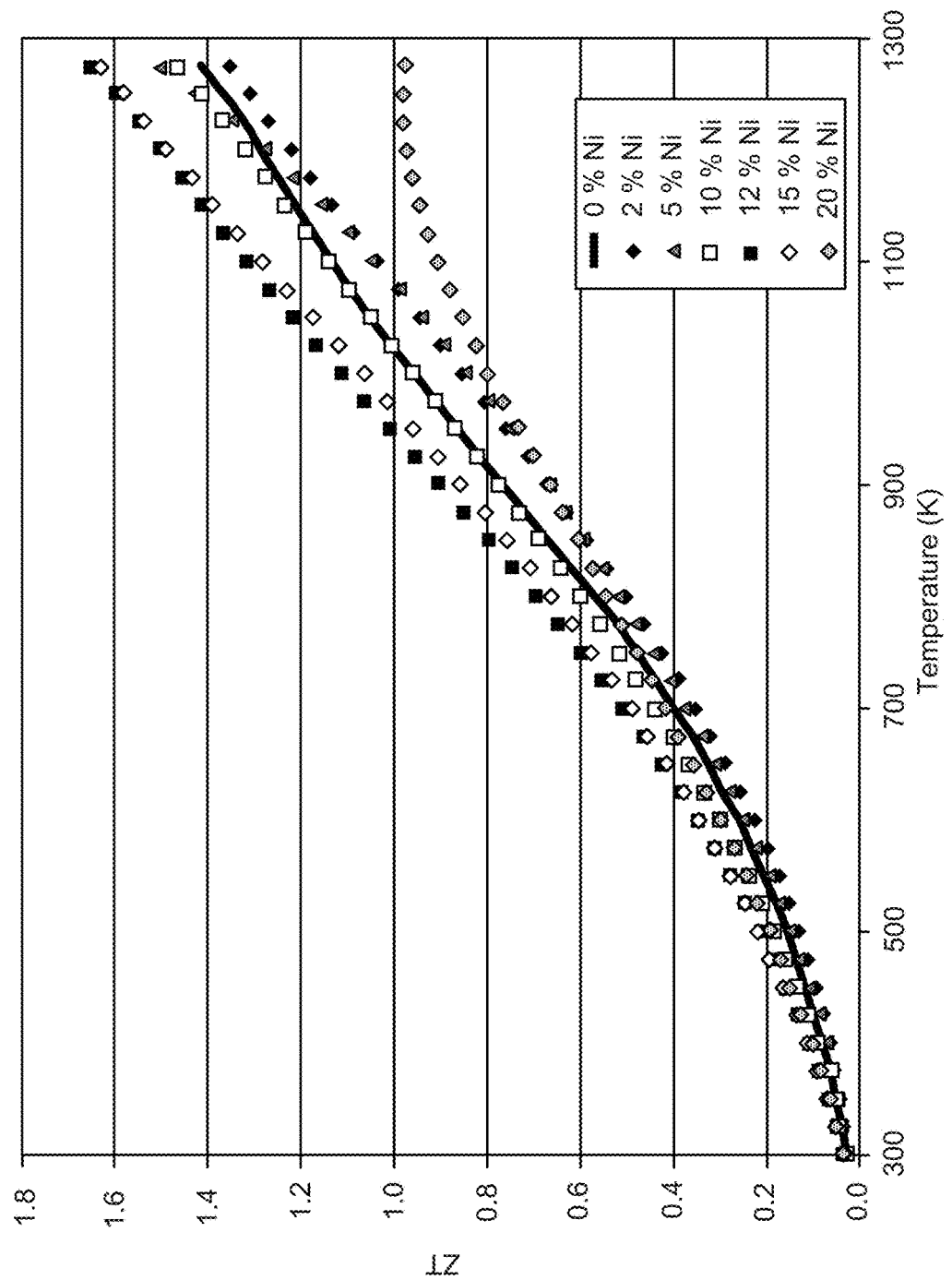
FIG. 10 shows measurements of the thermoelectric figure of merit (zT) as a function of temperature at various volume fractions of Ni for a $La_{2.77}Te_4$—Ni composite thermoelectric material.

FIG. 9 shows the thermal conductivity as a function of the volume fraction of Ni at 300K, 600K, 100K, and 1275K. At Ni volume fractions up to 10%, the thermal conductivity of the $La_{2.77}Te_4$—Ni samples remained relatively unchanged. For volume fractions above 10%, the thermal conductivity increases but only moderately from Ni volume fractions of 10 to 15%. Without being bound by any theory, increases in thermal conductivity caused by Ni inclusions may be suppressed by phonon scattering at the $La_{2.77}Te_4$—Ni interfaces due to large mismatches in thermal transport properties FIG. 10 shows the zT value as a function of temperature calculated using the resistivity, Seebeck coefficient, and thermal conductivity measurements shown in FIGS. 7-9. As seen in FIG. 10, the 2% (v/v), 5% (v/v), and 10% (v/v) $La_{2.77}Te_4$—Ni samples surprisingly demonstrated little or no change in zT across large temperature ranges. Further, the 12% (v/v) and 15% (v/v) samples demonstrated an increase in zT at all tested temperatures. This unexpected increase in zT results from the decoupling of electrical and thermal transport properties such that the electrical resistivity is reduced while the Seebeck coefficient and thermal conductivity at these volume fractions is relatively unchanged.

Example 2

Producing a $La_{3-x}Te_4$—Ni Composite Thermoelectric Material

This example provides another method according to the present invention or producing a composite thermoelectric material comprising $La_{3-x}Ta_4$ with Ni inclusions.

A $NiTe_{1.45}$ powder was initially prepared by high-energy ball milling and hot pressing. Ni powder (from Alfa Aesar) having a size of 2.2-3.0 microns was added to commercial lump Te (from Alfa Aesar) in an argon glove box. The mixture was then removed from the argon glove box and loaded into a stainless steel vial and sealed. The mixture was ball milled for about 6 hours using a SPEX mixer mill with 3" stainless steel ball bearings. The powder mixture was then loaded into 12.7 mm graphite dies and hot pressed at about 750° C. for about 60 minutes. The temperature profile included a 3° C./min increase to 750° C. followed by a cooling rate of 8° C./mi. The resulting solid $NiTe_{1.45}$ ingot was broken up into a powder having a size of about 1 mm. A $LaTe_{0.42}$ powder was separately prepared using a procedure previously reported by May and co-workers (A. May et al., Physical Review B, 2008, 78, 1-12).

A homogenous mixture of the $LaTe_{0.42}$ and $NiTe_{1.45}$ powders was then prepared. The $NiTe_{1.45}$ powder having a size of about 1 mm was added to the $LaTe_{0.42}$ powder to yield approximately 10% (v/v) of Ni in an argon glove box. The mixture was then removed from the argon glove box and loaded into a stainless steel vial and sealed. The mixture was ball milled for about 5 hours using a SPEX mixer mill with 0.5" stainless steel ball bearings. Upon milling, the vial was returned to the argon glove box. The powder mixture was then loaded into 12.7 mm graphite dies and transferred to a SPS furnace. The mixture was then sintered in the SPS furnace for approximately 30 minutes at a pressure of approximately 80 MPa and up to a temperature of approximately 1350° C. The temperature profile included a 30° C./min increase to 1350° C. followed by a cooling rate of 200° C./min.

Figure 11A:
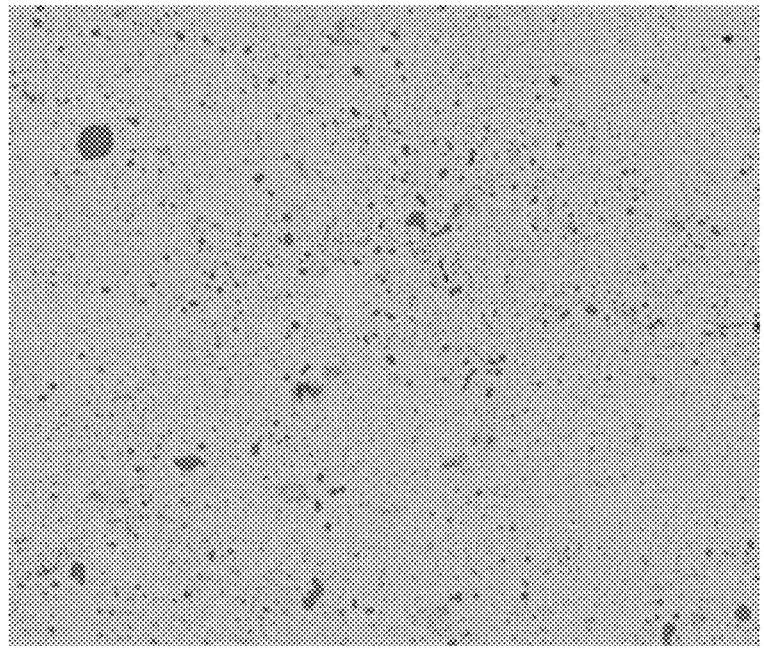
FIGS. 11A and 11B show low magnification SEM images of a $La_{2.76}Te_4$—Ni composite thermoelectric material formed from $NiTe_{1.45}$ powder and a $La_{2.77}Te_4$—Ni composite thermoelectric material formed from Ni powder.
Figure 11B:
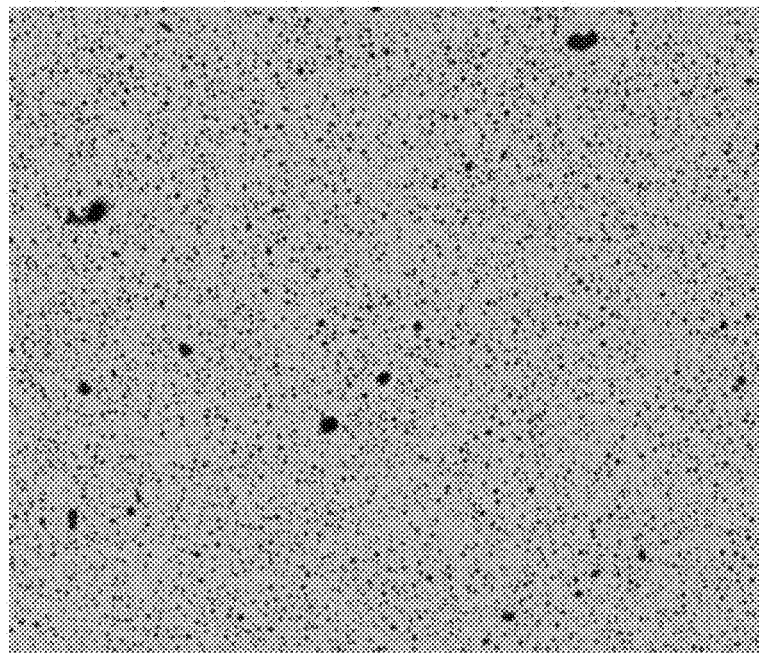

During sintering, the Te component of the $NiTe_{1.45}$ powder decomposed thereby resulting in a $La_{2.76}Te_4$—Ni composite. FIGS. 11A and 11B show low magnification SEM images of the $La_{2.76}Te_4$—Ni composite as compared to the $La_{2.77}Te_4$—Ni composite formed by the method described above in Example 1. In the composite formed from $NiTe_{1.45}$ powder (FIG. 11B), the Ni inclusions are smaller, less aggregated, and more randomly dispersed than in the composite formed from Ni powder (FIG. 11A). Such a finer dispersion of Ni may provide for a percolated electrical network at lower volume fractions of Ni.

Example 3

Producing a $La_{3-x}Te_4$—Co Composite Thermoelectric Material

This example provides a method according to the present invention of producing a composite thermoelectric material comprising $La_{3-x}Te_4$ with Co inclusions.

A homogenous mixture of $La_{2.77}Te_4$ and Co powders was prepared. The $La_{2.77}Te_4$ powder was prepared using a procedure previously reported by May and co-workers (A. May et al., Physical Review B, 2008, 78, 1-12). Co powder (from Alfa Aesar) having a size of 1.6 microns was added to $La_{2.77}Te_4$ powder to yield approximately 5% (v/v) of Co in an argon glove box. The mixture was then loaded into a stainless steel vial and sealed, and then removed from the argon glove box. The mixture was mixed for about 30 minutes using a SPEX mixer mill with no ball bearings. Upon mixing, the vial was returned to the argon glove box. The powder mixture was then loaded into 12.7 mm graphite dies and transferred to a SPS furnace. The mixture was then sintered in the SPS furnace for approximately 30 minutes at a pressure of approximately 80 MPa and up to a temperature of approximately 1350° C. The temperature profile included a 1350° C./min increase to 30° C. followed by a cooling rate of 200° C./min.

Vickers hardness tests were performed on the samples with the spalling (i.e. chipping) and crack formation caused by the Vickers indenter in the $La_{2.77}Te_4$—Co samples being compared to that of a $La_{2.77}Te_4$ baseline sample formed without Co. Reduced spalling and crack formation were observed in each of the tested samples.

Figure 12:
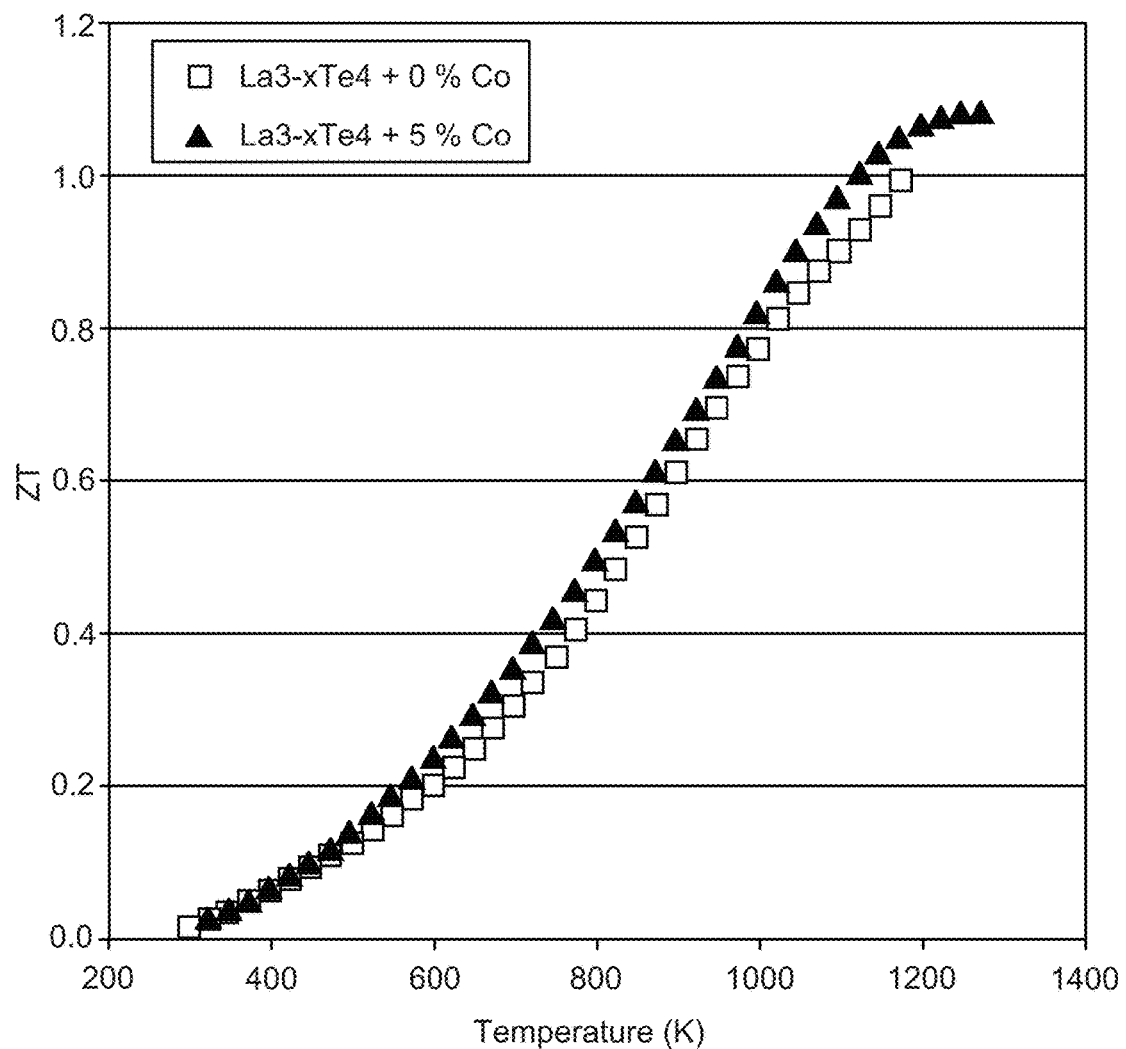
FIG. 12 shows measurements of the thermoelectric figure of merit (zT) as a function of temperature for a $La_{2.77}Te_4$—Co composite thermoelectric material with a Co volume fraction of 5%.

The electrical resistivity, thermal conductivity, and Seebeck coefficient of the sample were measured at various temperatures to calculate the corresponding zT. FIG. 12 shows the zT value as a function of temperature for the $La_{2.77}Te_4$—Co composite. As seen in FIG. 12, at 5% (v/v) Co, the composite surprisingly demonstrated little or no change in zT across large temperature ranges with slight increases in zT at some temperatures as compared to the $La_{2.77}Te_4$ baseline.

Example 4

Producing a $Yb_{14}MnSb_{11}$—Mo Composite Thermoelectric Material

This example provides a method according to the present invention of producing a composite thermoelectric material comprising $Yb_{14}MnSb_{11}$ with Mo inclusions.

A homogenous mixture of $Yb_{14}MnSb_{11}$ and Mo powders was prepared. The $Yb_{14}MnSb_{11}$ powder was prepared using a procedure previously reported by Star (K. Star, Synthesis and Characterization of 14-1-11 Ytterbium Manganese Antimonide Derivatives for Thermoelectric Applications, UCLA: Materials Science and Engineering 0328, 2013). Mo powder (from Climax) having a size of 100 nm was added to $Yb_{14}MnSb_{11}$ powder to yield approximately 2% (v/v) of Mo in an argon glove box. The mixture was then removed from the argon glove box and loaded into a stainless steel vial and sealed. The mixture was mixed for about 30 minutes using a SPEX mixer mill with no ball bearings. Upon mixing, the vial was returned to the argon glove box. The powder mixture was then loaded into 12.7 mm graphite dies and transferred to a SPS furnace. The mixture was then sintered in the SPS furnace for approximately 40 minutes at a pressure of approximately 80 MPa and up to a temperature of approximately 1200° C. The temperature profile included a 100° C./min increase to 1200° C. followed by a cooling rate of 1000° C./min.

The above method was repeated for a powder mixture comprising approximately 5% (v/v) of Mo. A sample including $Yb_{14}MnSb_{11}$ with no Mo was also prepared for purposes of comparison.

Vickers hardness tests were performed on the samples with the crack formation caused by the Vickers indenter in the $Yb_{14}MnSb_{11}$—Mo samples being compared to that of the $Yb_{14}MnSb_{11}$ baseline sample. The Vickers hardness increased by approximately 10 to 15%. Reduced crack formation was observed, and the 2% (v/v) Mo sample demonstrated an increase in average flexural strength of about 30%.

Figure 13:
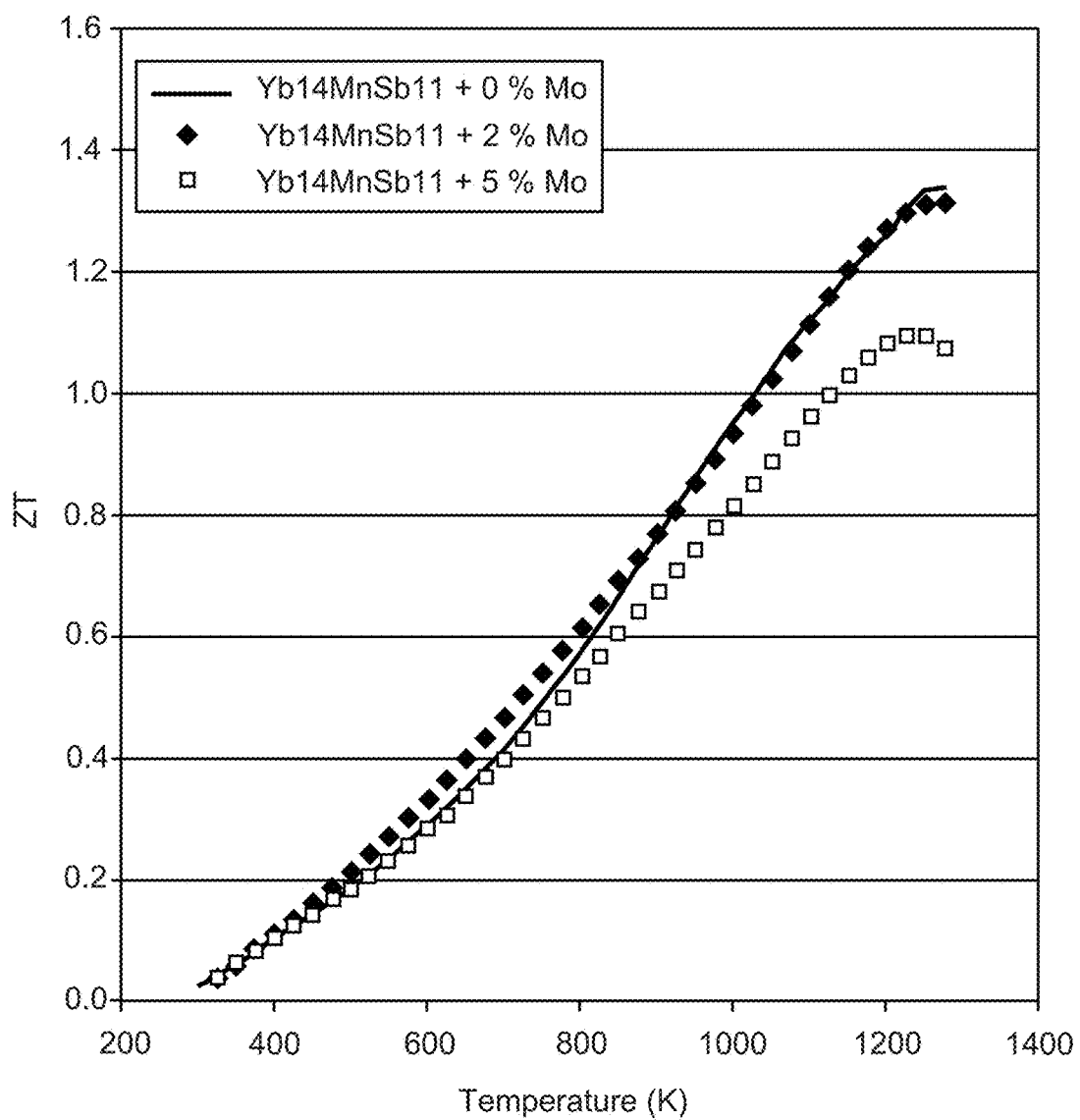
FIG. 13 shows measurements of the thermoelectric figure of merit (zT) as a function of temperature for $Yb_{14}MnSb_{11}$—Mo composite thermoelectric materials having Mo volume fractions of 2 and 5%

The electrical resistivity, thermal conductivity, and Seebeck coefficient of each sample were measured at various temperatures to calculate the corresponding zT. FIG. 13 shows the zT value as a function of temperature for the $Yb_{14}MnSb_{11}$—Mo composite. As seen in FIG. 13, at 2% (v/v) Mo, the composite surprisingly demonstrated little or no change in zT across all temperatures tested as compared to the $Yb_{14}MnSb_{11}$ baseline. At a volume fraction of 5%, the composite demonstrated a moderate decrease in zT up to about 800K, with more noticeable reductions at higher temperatures.

Although the foregoing invention has been described in some detail by way of illustration and example for purposes of clarity of understanding, one of skill in the art will appreciate that certain changes and modifications can be practiced within the scope of the appended claims. In addition, each reference provided herein is incorporated by reference in its entirety to the same extent as if each reference was individually incorporated by reference. Where a conflict exists between the instant application and a reference provided herein, the instant application shall dominate.

What is claimed is:

1. A composite thermoelectric material comprising:
a semiconductor material; and
a metal forming metallic inclusions distributed throughout the semiconductor material;
wherein:
(i) the semiconductor material is $La_{3-x}Te_4$, subscript x is from about 0 to 0.33 the metal is Ni, and the metallic inclusions comprise about 0.1 to 18% (v/v) of the composite thermoelectric material;
(ii) the semiconductor material is $La_{3-x}Te_4$, subscript x is from about 0 to 0.33 the metal is Co, and the metallic inclusions comprise about 0.1 to 5.0% (v/v) of the composite thermoelectric material; or
(iii) the semiconductor material is $Yb_{14}MnSb_{11}$, the metal is Mo, and the metallic inclusions comprise about 0.1 to 2.0% (v/v) of the composite thermoelectric material.

2. The composite thermoelectric material of claim 1, wherein the semiconductor material is $La_{3-x}Te_4$, wherein subscript x is from about 0 to 0.33, wherein the metal is Ni, and wherein the metallic inclusions comprise about 0.1 to 18% (v/v) of the composite thermoelectric material.

3. The composite thermoelectric material of claim 2, wherein the metallic inclusions comprise about 10 to 18% (v/v) of the composite thermoelectric material.

4. The composite thermoelectric material of claim 1, wherein the semiconductor material is $La_{3-x}Te_4$, wherein subscript x is from about 0 to 0.33, wherein the metal is Co, and wherein the metallic inclusions comprise about 0.1 to 5.0% (v/v) of the composite thermoelectric material.

5. The composite thermoelectric material of claim 1, wherein the semiconductor material is $Yb_{14}MnSb_{11}$, wherein the metal is Mo, and wherein the metallic inclusions comprise about 0.1 to 2.0% (v/v) of the composite thermoelectric material.

6. The composite thermoelectric material of claim 1, wherein the composite thermoelectric material has a figure of merit (zT) about equal to or greater than the figure merit of the semiconductor material.

7. A method of preparing a composite thermoelectric material comprising:
compacting a reaction mixture comprising a semiconductor material and a metal, wherein the semiconductor material comprises a rare earth metal, wherein the metal is selected from the group consisting of Sc, Ti, V, Cr, Mn, Fe, Co, Ni, Zn, Y, Zr, Mo, Ru, Rh, Pd, Cd, Hf, Ta, W, Re, Os, Ir, Pt, and Hg, wherein the atomic percent of the rare earth metal in the semiconductor material is at least about 20%, wherein the reaction mixture is in powder form, wherein the compacting comprises sintering the reaction mixture, and wherein the compacting forms metallic inclusions distributed throughout the semiconductor material, thereby preparing the composite thermoelectric material.

8. The method of claim 7, wherein the semiconductor material is selected from the group consisting of $La_{3-x}Te_4$ and $Yb_{14}MnSb_{11}$, wherein subscript x is from about 0 to 0.33, wherein the metal is selected from the group consisting of Co, Ni, and Mo.

9. A composite thermoelectric material prepared by a method comprising:
compacting a reaction mixture comprising a semiconductor material and a metal, wherein the semiconductor material comprises a rare earth metal, wherein the metal is selected from the group consisting of Sc, Ti, V, Cr, Mn, Fe, Co, Ni, Zn, Y, Zr, Mo, Ru, Rh, Pd, Cd, Hf, Ta, W, Re, Os, Ir, Pt, and Hg, and wherein the atomic percent of the rare earth metal in the semiconductor material is at least about 20%, wherein the reaction mixture is in powder form, and wherein the compacting comprises sintering the reaction mixture, thereby preparing the composite thermoelectric material comprising:
the semiconductor material comprising the rare earth metal; and
the metal forming metallic inclusions distributed throughout the semiconductor material.

10. The composite thermoelectric material of claim 9, wherein the semiconductor material is selected from the group consisting of $La_{3-x}Te_4$ and $Yb_{14}MnSb_{11}$, wherein subscript x is from about 0 to 0.33, wherein the metal is selected from the group consisting of Co, Ni, and Mo.

11. The composite thermoelectric material of claim 9, wherein the composite thermoelectric material has a figure of merit (zT) about equal to or greater than the figure merit of the semiconductor material.

12. The composite thermoelectric material of claim 9, wherein the method comprises:
    compacting the reaction mixture comprising a semiconductor material and a metal, wherein the reaction mixture is in powder form, wherein the semiconductor material comprises a rare earth metal, wherein the atomic percent of the rare earth metal in the semiconductor material is at least about 20%, wherein the semiconductor material is selected from the group consisting of $La_{3-x}Te_4$ and $Yb_{14}MnSb_{11}$, wherein subscript x is from about 0 to 0.33, wherein the metal is selected from the group consisting of Co, Ni, and Mo, and wherein the compacting comprises sintering the reaction mixture, thereby preparing the composite thermoelectric material comprising:
    the semiconductor material comprising the rare earth metal; and
    the metal forming metallic inclusions distributed throughout the semiconductor material, wherein the composite thermoelectric material has a figure of merit (zT) about equal to or greater than the figure merit of the semiconductor material.

\* \* \* \* \*